(12) United States Patent
Dhingra et al.

(10) Patent No.: US 12,733,196 B2
(45) Date of Patent: Sep. 8, 2026

(54) $HFS_3$ FIELD-EFFECT TRANSISTORS WITH A TWO-DIMENSIONAL HOLE GAS

(71) Applicant: NUTech Ventures, Inc., Lincoln, NE (US)

(72) Inventors: Archit Dhingra, Lincoln, NE (US); Peter A. Dowben, Lincoln, NE (US); Alexey Lipatov, Lincoln, NE (US); Alexander Sinitskii, Lincoln, NE (US)

(73) Assignee: Board of Regents of the University of Nebraska, Lincoln, NE (US)

( * ) Notice: Subject to any disclaimer, the term of this patent is extended or adjusted under 35 U.S.C. 154(b) by 358 days.

(21) Appl. No.: 18/490,151

(22) Filed: Oct. 19, 2023

(65) Prior Publication Data

US 2024/0162342 A1 May 16, 2024

Related U.S. Application Data

(60) Provisional application No. 63/380,130, filed on Oct. 19, 2022.

(51) Int. Cl.
*H10D 30/47* (2025.01)
*H10D 62/80* (2025.01)

(52) U.S. Cl.
CPC ......... *H10D 30/4755* (2025.01); *H10D 62/80* (2025.01)

(58) Field of Classification Search
CPC .. H10D 30/4755; H10D 62/80; H10D 30/675; H10D 64/647
See application file for complete search history.

(56) References Cited

U.S. PATENT DOCUMENTS

| | | | |
|---|---|---|---|
| 9,472,686 B2 | 10/2016 | Hersam et al. | |
| 9,991,371 B2 | 6/2018 | Kim et al. | |
| 11,094,839 B1 | 8/2021 | Engel et al. | |
| 2014/0197459 A1 | 7/2014 | Kis et al. | |

OTHER PUBLICATIONS

Dhingra. et al. (Journal of Materials Research 38, 52â68 (2023)-NPLDhingra0922) (Year: 2022).*
He et al. (ACS Nano 2019, 13, 12294-12300-NPLHe19) (Year: 2019).*
O Island et al (2017 2D Mater. 4 022003-NPLOIsland17) (Year: 2017).*

(Continued)

*Primary Examiner* — Christine S. Kim
*Assistant Examiner* — Nathalie R Fayette
(74) *Attorney, Agent, or Firm* — Gerald T. Gray; Leydig, Voit & Mayer, LTD.

(57) ABSTRACT

$HfS_3$-based semiconductor devices that include a substrate layer, a substrate dielectric layer formed on the substrate layer, a bulk layer formed on the substrate dielectric layer, the bulk layer comprising as-synthesized n-type $HfS_3$, and a p-type $HfS_3$ layer formed on the bulk layer, wherein the p-type $HfS_3$ comprises the two-dimensional hole gas (2DHG) layer. FET devices further include first and second electrodes located on the substrate dielectric layer and forming a semiconductor channel between the first and second electrodes.

18 Claims, 5 Drawing Sheets

(56) References Cited

OTHER PUBLICATIONS

Patra et al. (RSC Adv., 2020, 10, 36413-36438-NPLPatra20) (Year: 2020).*
Ponomarenko et al. ( J. Commun. Technol. Electron. 67, 1134â1151 (2022)-NPLPonomarenko22) (Year: 2022).*
Xiong et al. (J. Mater. Chem. C, 2015,3, 1929-1934-NPLXiong15) (Year: 2015).*
Wei-Wei Xong et al., "Individual HfS3 nanobelt for field-effect transistor and high performance visible-light detector" *Journal of Materials Chemistry C* (2014).
Archit Dhingra et al., "Quasi-One-Dimensional Transition-Metal Trichalcogenide for Low-Dimensional Electronic Device Applications".
Archit Dhingra et al., "Effect of Au/HfS3 interfacial interactions on properties of HfS3-based devices" *Physical Chemistry Chemical Physics*, vol. 24, pp. 14016-14021 (2022).

* cited by examiner

$HfS_3$ FIELD-EFFECT TRANSISTORS WITH A TWO-DIMENSIONAL HOLE GAS

CROSS-REFERENCE TO RELATED APPLICATIONS

This application claims the benefit of priority to U.S. Provisional Patent Application No. 63/380,130, filed Oct. 19, 2022, titled "$HfS_3$ FIELD-EFFECT TRANSISTORS WITH A TWO-DIMENSIONAL HOLE GAS", which is hereby incorporated by reference in its entirety.

FEDERALLY SPONSORED RESEARCH OR DEVELOPMENT

This invention was made with Government support under ECCS2025298 and OIA2044049 awarded by the National Science Foundation. The Government has certain rights in this invention.

FIELD

The present disclosure provides transition metal trichalcogenide (TMT) semiconductor devices, and in particular $HfS_3$-based field effect transistors (FETs) with a two-dimensional hole gas (2DHG) layer.

$HfS_3$ is deemed to be a promising 2D material for nanodevice applications; however, $HfS_3$ FETs have been previously known to portray poor device characteristics [W. W. Xiong et al., J. Mater. Chem. C, 2014, 2, 7392-7395; A. Dhingra et al., Phys. Chem. Chem. Phys., 2022, 24, 14016-14021].

SUMMARY

Advantageously, according to embodiments herein, creation of a 2DHG in $HfS_3$ FETs is a viable way to tackle the issue of unimpressive characteristics of $HfS_3$-based devices. Without being bound to a particular theory, this is because the hole gas mobility is high and somewhat insensitive to thermal (phonon) effects.

Oxygen chemisorption renders the surface of $HfS_3$ p-type, while the bulk of as-synthesized $HfS_3$ is n-type. Despite the fact that $HfS_3$ FETs have very low charge carrier mobilities, the intrinsic p-n junction in $HfS_3$ FETs can advantageously be used to realize a 2DHG in $HfS_3$ devices such as FETs. Realizing a 2DHG in an $HfS_3$ FET involves widening the depletion region enough, which is obtained as a consequence of the intrinsic p-n junction, to create an inversion layer. And such an inversion layer can be exploited to make a 2DHG in an $HfS_3$ FET by confining holes to the p-type surface of $HfS_3$, which enhances its charge carrier mobility by several orders of magnitude.

According to an embodiment, a $HfS_3$-based semiconductor device includes a substrate layer, a substrate dielectric layer on the substrate layer, a bulk layer on the substrate dielectric layer, the bulk layer comprising as-synthesized n-type $HfS_3$, and a p-type $HfS_3$ layer formed on the bulk layer, wherein the p-type $HfS_3$ comprises the two-dimensional hole gas (2DHG) layer.

According to an embodiment, a $HfS_3$-based semiconductor device includes a substrate layer, a substrate dielectric layer formed on the substrate layer, a bulk layer formed on the substrate dielectric layer, the bulk layer comprising as-synthesized n-type $HfS_3$, and a p-type $HfS_3$ layer formed on the bulk layer, wherein the p-type $HfS_3$ comprises the two-dimensional hole gas (2DHG) layer.

In an embodiment, the substrate layer comprises p-doped Si. In certain aspects, the Si substrate layer is heavily doped. In certain aspects, the Si substrate layer has a doping concentrations of $10^{18}/cm^3$ or greater or an effective resistance of 30 Ohm·cm or less. In certain aspects, other semiconducting materials may be used as a substrate.

In an embodiment, the substrate dielectric layer comprises $SiO_2$. In certain aspects, other dielectric oxides may be used as a gate oxide material.

In an embodiment, the $HfS_3$-based semiconductor device is a field effect transistor (FET) device, and the device further includes first and second electrodes located on the substrate dielectric layer and forming a semiconductor channel between the first and second electrodes. The first and second electrodes each preferably comprise Au, e.g., pure Au. In an embodiment, a Schottky-barrier is formed at an interface between the p-type $HfS_3$ surface and each of the first and second Au electrodes.

In an embodiment, a $HfS_3$-based field effect transistor (FET) device includes a Si substrate layer, a $SiO_2$ substrate dielectric layer on the substrate layer, a bulk layer on the substrate dielectric layer, the bulk layer comprising as-synthesized n-type $HfS_3$, a p-type $HfS_3$ layer formed on the bulk layer, wherein the p-type $HfS_3$ comprises the two-dimensional hole gas (2DHG) layer, and first and second Au electrodes located on the $SiO_2$ substrate dielectric layer and forming a semiconductor channel between the first and second electrodes.

In an embodiment, device dimensions include channel widths of 3.6 nm to 50 nm, $HfS_3$ thickness less than 40 nm, a dielectric layer with a thickness sufficient to reliably avoid pinholes (electrical shorts) above the substrate that acts as the effective gate, and/or electrode dimensions on the scale to the transistor widths.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWINGS

The detailed description is described with reference to the accompanying figures. The use of the same reference numbers in different instances in the description and the figures may indicate similar or identical items.

Panel (c) shows the raw photoemission spectrum of the Hf 4f core-level (red triangles) along with the total fit to the raw spectrum (solid black). The Hf $4f_{7/2}$ (16.0 eV) and Hf $4f_{5/2}$ (17.7 eV) core-level peaks (in red) are attributed to the Hf—S bonding environment, while the Hf $4f_{7/2}$ (16.7 eV) and Hf $4f_{5/2}$ (18.4 eV) core-level peaks (in blue) are attributed to the Hf—O bonding environment.

Figure 4:
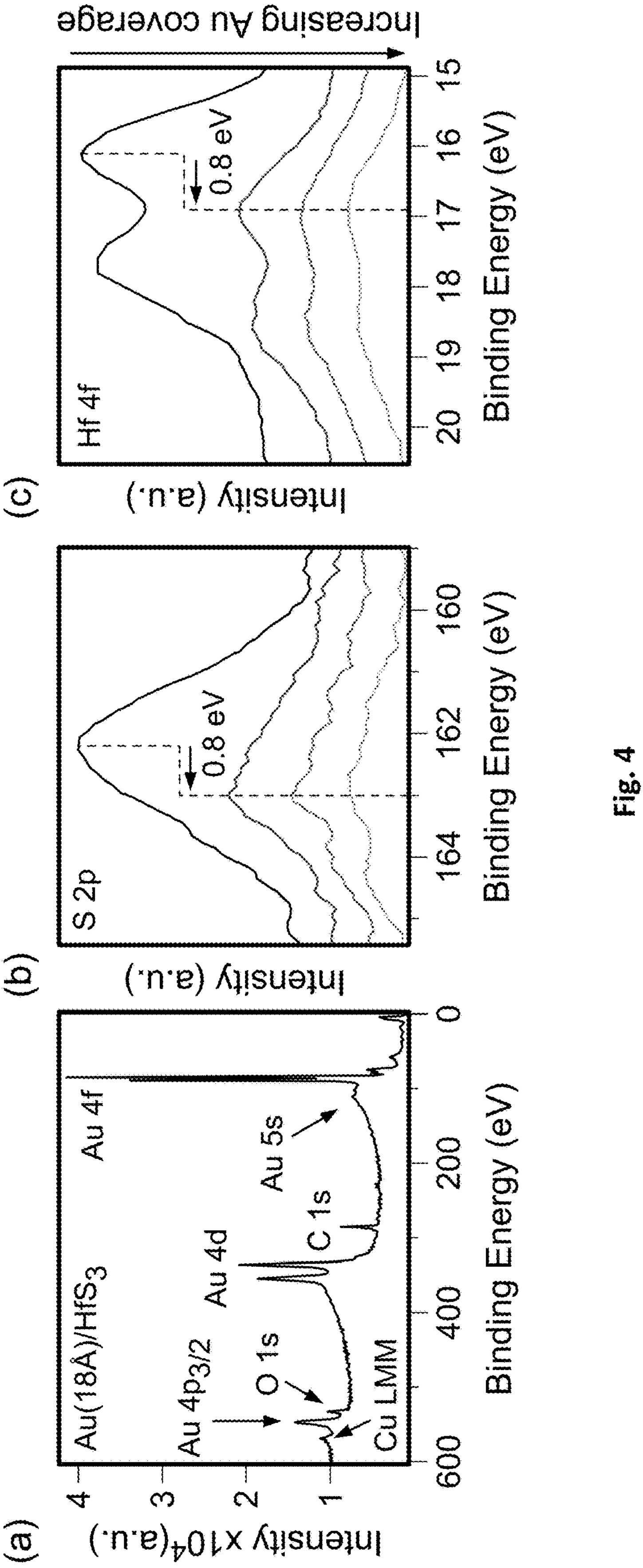

FIG. 4 shows Au thickness-dependent XPS measurements of $HfS_3$. Panel (a) shows a survey XPS of $HfS_3$ with 18 Å of Au adlayer thickness; Panel (b) shows the S 2p; and Panel (c) shows Hf 4f core-level photoemission spectra as a function of Au adlayer thickness. Here, the spectra shown in red, blue, green, and purple were collected for 0 Å of Au coverage (i.e., bare $HfS_3$), 6 Å of Au coverage, 12 Å of Au coverage and 18 Å of Au coverage, respectively. The vertical dashed lines denote the peak XPS binding energies of the S 2p and Hf 4f core-levels, and the horizontal dashed line denotes the shift (of ~0.8 eV) in their respective biding energies.

Figure 5:
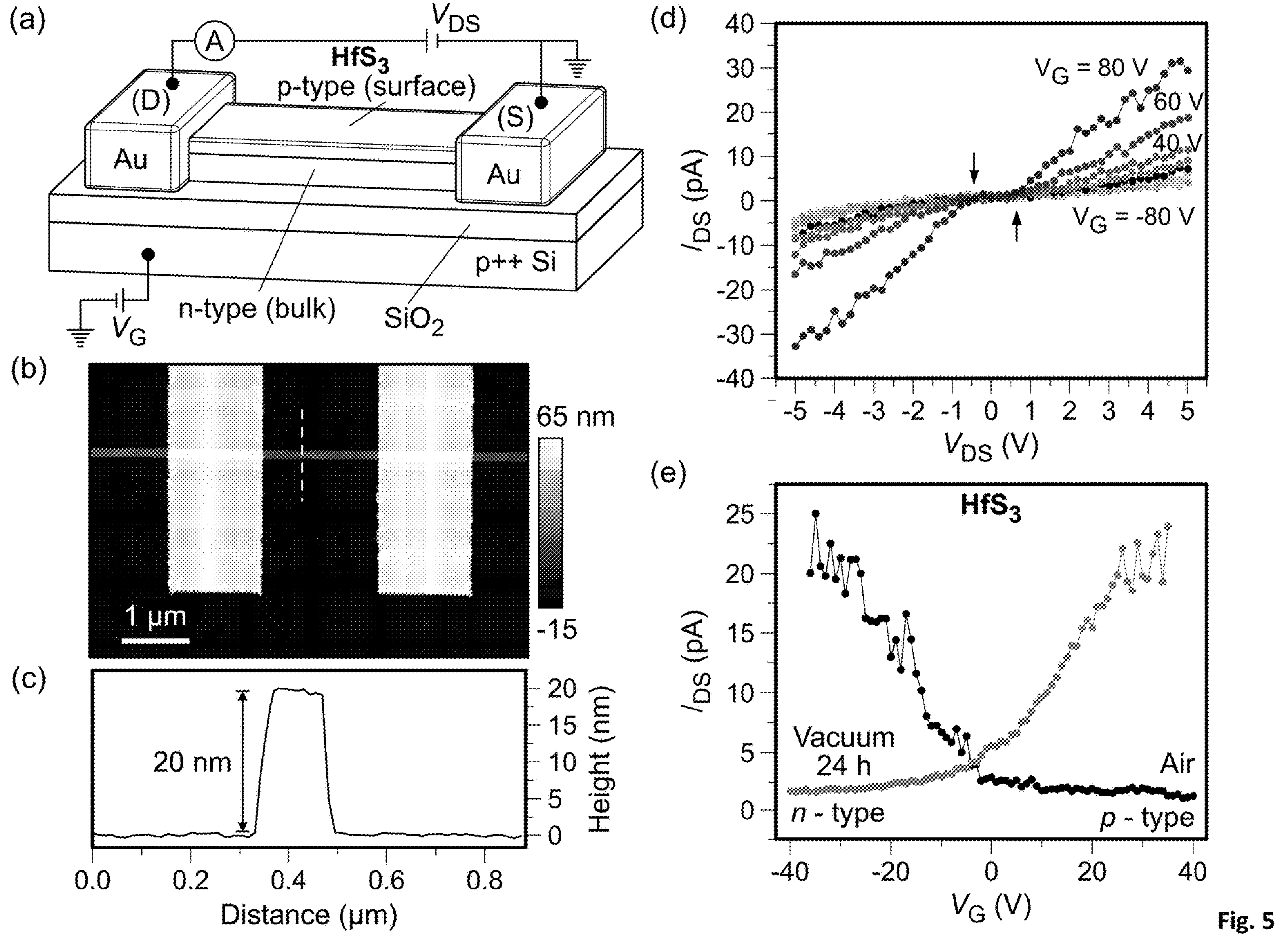

FIG. 5 shows a $HfS_3$-based semiconductor device embodiment and characteristics of the device. Panel (a) shows a schematic of a $HfS_3$ FET embodiment of FIG. 1. In addition to the geometry of the electrodes and the device channel, it also (rather exaggeratedly) shows a relatively thin p-type surface of a material whose bulk is n-type. The p-type surface is formed because of chemisorption of oxygen on the n-type $HfS_3$, as is evident from FIG. 3, panel (c). Panel (b) shows an AFM image of the $HfS_3$ FET embodiment and Panel (c) shows its corresponding height profile. Panel (d) shows the $I_{DS}$-$V_{DS}$ curves of the $HfS_3$ FET measured in vacuum at the gate voltages (V G) varied from 80 V to +80 V. Panel (e) shows transfer characteristics of the same device measured in air (black) and in vacuum (red). $V_{DS}$=5V.

DETAILED DESCRIPTION

The following detailed description is exemplary in nature and is not intended to limit the invention or the application and uses of the invention. Furthermore, there is no intention to be bound by any expressed or implied theory presented in the following detailed description or the appended drawings.

Turning to the drawings, and as described in detail herein, embodiments of the disclosure provide transition metal trichalcogenide (TMT) semiconductor devices, such as $HfS_3$-based field effect transistors (FETs), with a two-dimensional hole gas (2DHG) layer.

Figure 1:
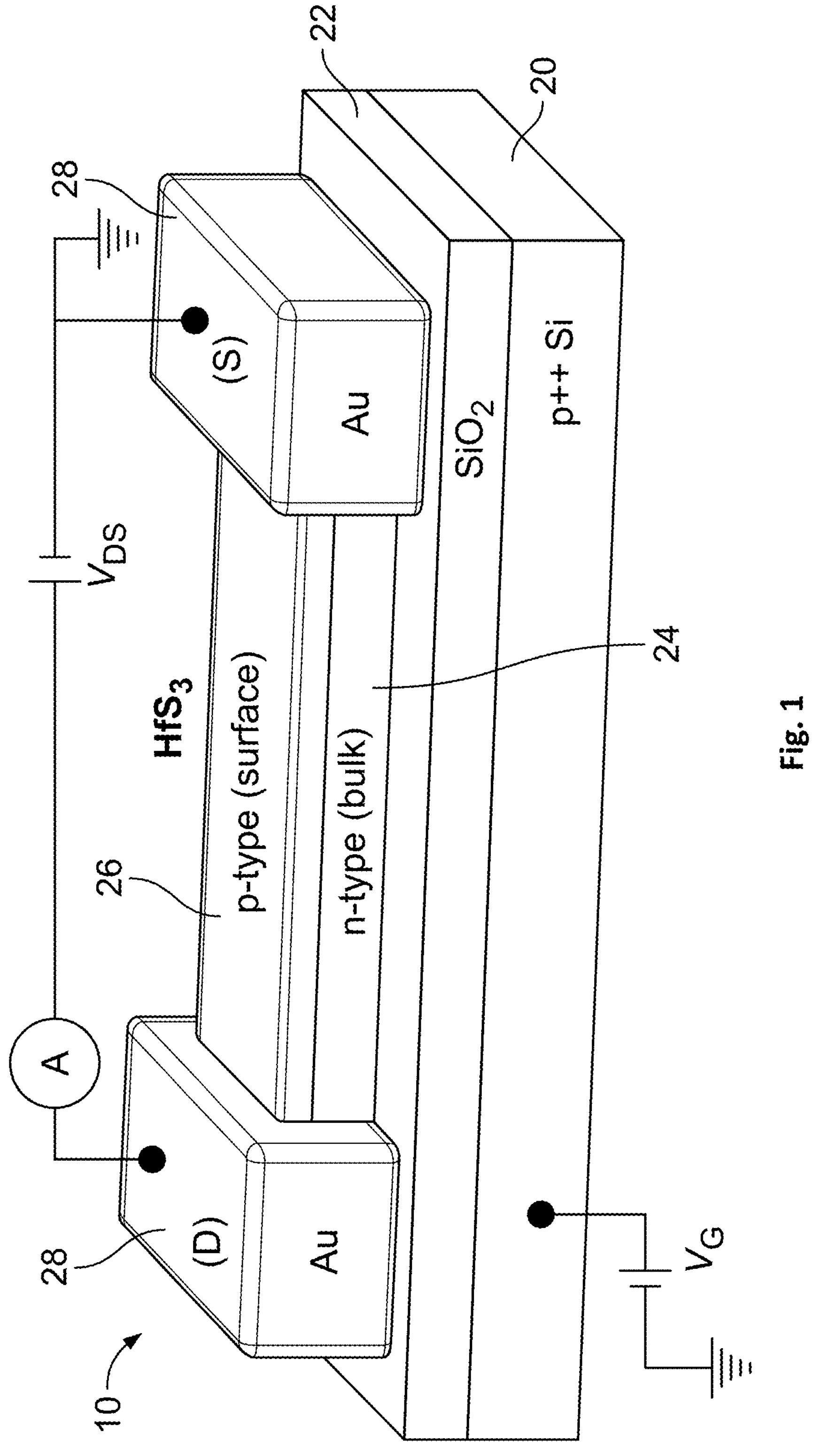
FIG. 1 shows a schematic of a $HfS_3$-based semiconductor device according to an embodiment.
Figure 2:
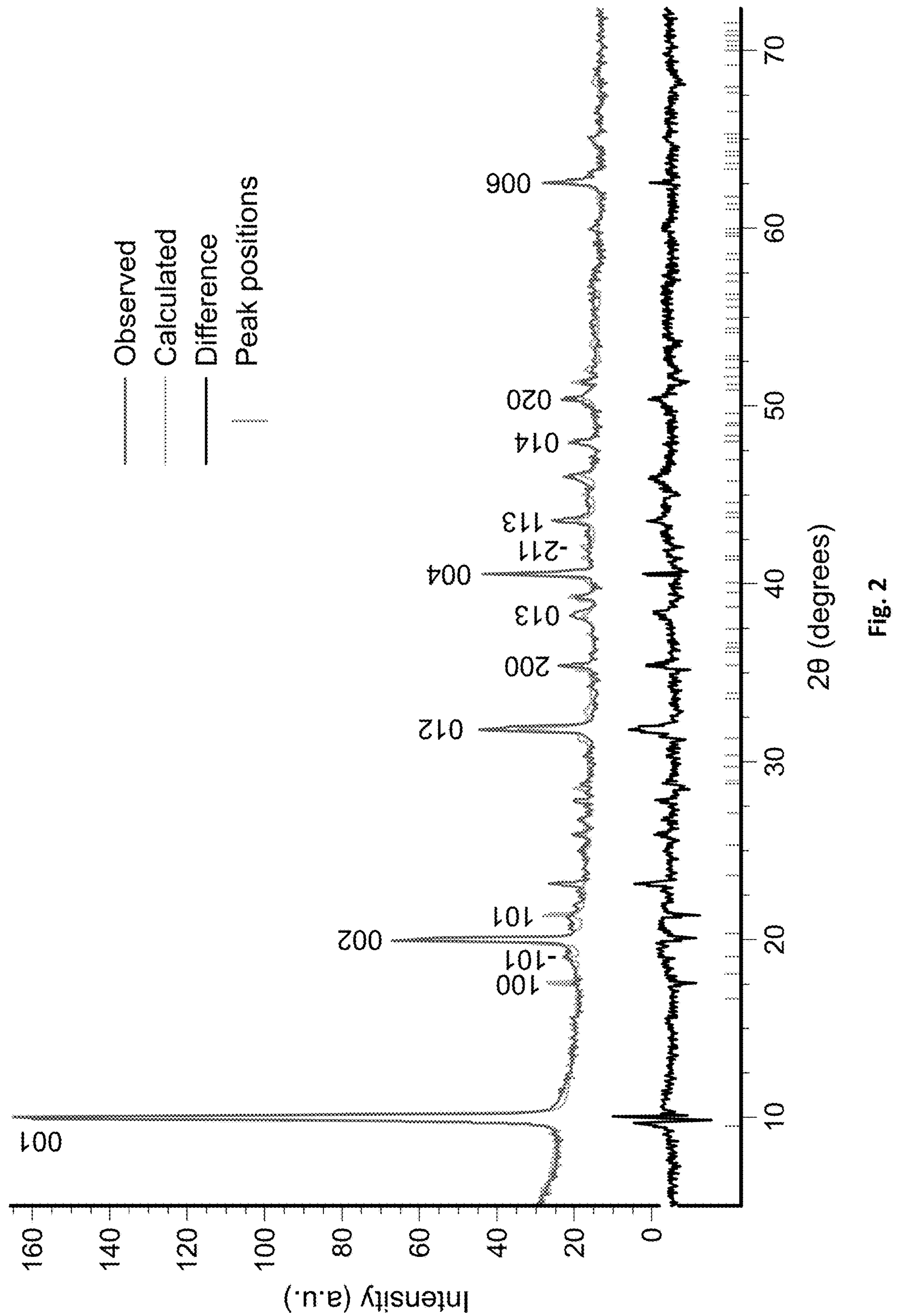
FIG. 2 shows a powder XRD pattern of $HfS_3$ accompanied by the Rietveld analysis. Here, peak positions are matched with the prior XRD (ICSD-42074).

FIG. 1 illustrates a semiconductor device 10 according to an embodiment. Device 10 includes a substrate layer 20 and a substrate dielectric layer 22 on the substrate layer 20. A bulk layer 24 on the substrate dielectric layer 22 comprises n-type $HfS_3$. A p-type $HfS_3$ layer 26 is formed on the bulk layer 24, wherein the p-type $HfS_3$ comprises the two-dimensional hole gas (2DHG) layer. In field effect transistor device embodiments, device 10 may further include first and second electrodes 28 located on the substrate dielectric layer 22 and forming a semiconductor channel between the first and second electrodes 28. One of the electrodes functions as a drain (D) and the other functions as a source (S), with the semiconductor channel therebetween.

In an embodiment, substrate layer 20 includes a silicon material, such as a p-doped silicon (Si) substrate, which may be heavily doped (p++), and dielectric layer 22 includes $SiO_2$, or other oxide. Electrodes 28 include a metal material, for example Au or Cr/Au.

In certain embodiments, the device dimensions may vary widely. For example, the $HfS_3$. Channel may have a width of between about 3.5 or 3.6 nm to about 50 nm, and a thickness (height) of less than about 40 nm, e.g. a uniform thickness of between about 1 nm and about 40 nm. The length of the channel may range from about 0.1 mm to about 0.5 mm. The substrate dielectric layer 22 has a thickness sufficient to reliably avoid pinholes or electrical shorts above the substrate that acts as the effective gate. For example, the thickness of substrate dielectric layer 22 may be between about 100 nm to about 500 nm, e.g., 300 nm. Electrodes 28 have dimensions commensurate or on scale with the semiconductor channel, e.g., widths and heights commensurate with (e.g., slightly larger than) the channel width and height, respectively, e.g., about 45 nm.

To validate devices according to the present embodiment, $HfS_3$ single crystals were grown, FET devices fabricated, electrode (Au) thickness-dependent X-ray photoemission spectroscopy (XPS) measurements were taken to probe the interaction at the electrode/$HfS_3$ interface, and electrical transport measurements of the FETs were taken to elucidate semiconducting behavior as discussed in the Experimental section, below. The XPS measurements reveal dissociative chemisorption of $O_2$, leading to the formation of an oxide of Hf at the surface of $HfS_3$.

Figure 3:
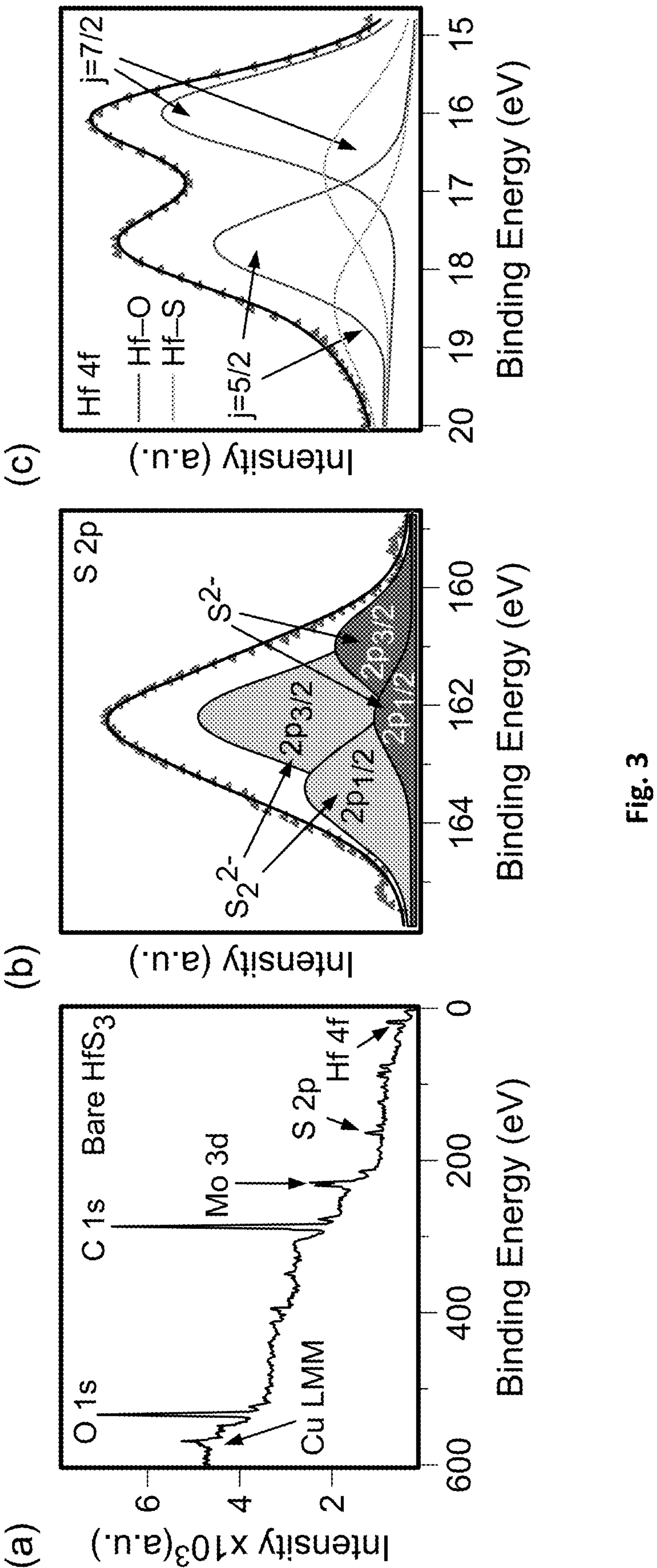
FIG. 3 shows XPS measurements of bare $HfS_3$. Panel (a) shows a survey XPS of bare $HfS_3$ with S 2p and Hf 4f core-level peaks of $HfS_3$. The Mo 3d core-level peak and Cu LMM (Auger electron transition) peak are due to the sample holder, while the C is and O is core-level peaks are attributed to adventitious contamination. Panel (b) shows the raw XPS spectrum of the S 2p core-level (red triangles) along with the fits (shaded in red) showing the $S^{2-}$ $2p_{3/2}$ (161 eV), $S^{2-}$ $2p_{1/2}$, (162.2 eV), $S_2^{2-}$ $2p_{3/2}$ (162.2 eV) and $S_2^{2-}$ $2p_{3/2}$ (163.4 eV) core-level components. The total fit to the raw XPS spectrum of the S 2p core-level is shown in solid black.

Survey XPS spectrum of the bare $HfS_3$ single crystals showing all the major peaks is presented in FIG. 3, panel (a) where the S 2p and Hf 4f core-level peaks belong to the $HfS_3$ crystals, whereas the Mo 3d and Cu LMM (Auger electron transition) peaks are attributed to the sample holder. The C is peak is characteristic of the conductive carbon tape on which the $HfS_3$ crystals were mounted and the O is peak has to do with the surface oxidation of these crystals (this is discussed in more detail below). Further analysis of the raw S 2p core-level XPS spectrum (FIG. 3, panel (b)) indicates that it includes four S 2p components: $S^{2-}$ $2p_{3/2}$ (161±0.1 eV), $S^{2-}$ $2p_{1/2}$ (162.2±0.1 eV), $S^{2-}$ $2p_{3/2}$ (162.2±0.1 eV) and $S_2^{2}$-$2p_{1/2}$ (163.4±0.1 eV). The binding energy values of these four S 2p core-level components are in agreement with the binding energies of the four S 2p core-level components of $TiS_3$ and $ZrS_3$, which is to be expected since $HfS_3$ is isostructural with $TiS_3$ and $ZrS_3$. FIG. 3, panel (c) shows the raw (red triangles) and fitted (solid black) XPS spectrum of the Hf 4f core-level. The fit results disclose that the Hf 4f core-level XPS spectrum contains two Hf $4f_{7/2}$ peaks and two Hf $4f_{5/2}$ peaks, with the spin-orbit splitting between each doublet being B1.7 eV. The Hf $4f_{7/2}$ core-level peak observed at 16.0±0.1 eV and the Hf $4f_{5/2}$ core-level peak observed at 17.7±0.1 eV are attributed to the Hf—S bonding environment, whereas the Hf $4f_{7/2}$ core-level peak observed at 16.7±0.1 eV and the Hf $4f_{5/2}$ core-level peak observed at 18.4±0.1 eV are attributed to the Hf—O bonding environment. The Hf $4f_{7/2}$ peak observed at 16.7±0.1 eV is consistent with the binding energy of Hf $4f_{7/2}$ core-level of $HfO_2$, implying chemisorption of $O_2$ at the $HfS_3$ surface. This result is noteworthy in that even though the dissociative adsorption of $O_2$ on $HfS_3$ may have been implied by Xiong et al. [W. W. Xiong, J. Q. Chen, X. C. Wu and J. J. Zhu, *J. Mater. Chem. C,* 2014, 2, 7392-7395.], its precise nature was not clarified.

FIG. 4, panel (a) shows the XPS survey scan of $HfS_3$ with 18 Å of Au at its surface. On comparing this survey XPS with the survey XPS of bare $HfS_3$ (shown in FIG. 3, panel (a)), it can be inferred that the XPS signal intensity for Au(18 Å)/$HfS_3$ is dominated by Au. This, however, is not surprising as XPS is a surface sensitive technique with sampling depths of only a few nanometers. FIG. 4, panel (b) and panel (c) show the Au thickness-dependent representative photoemission spectra of the S 2p and Hf 4f core-levels, respectively. In these figures, a clear shift of ~0.8 eV to higher binding energies for both the core-levels is observed upon interfacing $HfS_3$ with 6 Å of Au (blue). No further shift in the binding energies of the XPS core levels of $HfS_3$ is observed upon increasing the Au adlayer thickness. That is to say, the XPS peaks of the S 2p and Hf 4f core levels of Au/$HfS_3$ are shifted by ~0.8 eV towards higher binding energies for all coverages of Au [i.e., 6 Å (blue), 12 Å (green), and 18 Å (purple)] in comparison with their peaks for the bare $HfS_3$. Therefore, this shift to the higher binding energies for both the core levels is independent of the Au adlayer thickness. In the absence of surface charging, such a shift towards higher binding energies implies this is an interface effect associated with some band bending.

Such a shift, towards higher binding energies (or lower electron energies), implies downward bending of the conduction and valence bands of $HfS_3$ at the surface. And it is well-known that downward band bending is indicative of a Schottky-barrier formation at the metal/p-type semiconductor interface. Therefore, these Au thickness-dependent XPS measurements confirm the existence of a Schottky barrier at the Au/$HfS_3$ interface. Existence of a Schottky barrier at the Au/$HfS_3$ interface, as opposed to its absence at the Au/$ZrS_3$ and Au/$TiS_3$ interfaces, can be explained in terms of varying metal-sulphur interactions among the family of TMTs. In other words, the stronger the TMT metal-sulfur interaction, the weaker the Au—S interaction. Since the electronegativity of Hf is lower than that of both Zr and Ti, the Au—S interaction at the Au/$HfS_3$ interface is weaker than it is at either the Au/$ZrS_3$ or Au/$TiS_3$ interface. Thus, the absence of a strong Au—S interfacial interaction (presence of which suppresses Schottky-barrier formation at the Au/$ZrS_3$ and Au/$TiS_3$ interfaces) results in the formation of a Schottky barrier at the Au/$HfS_3$ interface. Additionally, these measurements suggest that the work function of the $HfS_3$ surface with chemisorbed oxygen may be higher than that of Au; otherwise, formation of a p-type Schottky barrier at the Au/$HfS_3$ interface would not be possible. This is consistent with theory, which indicates that the work function of $HfS_3$ (~5.5 eV) is actually higher than that of Au (~5.1 eV).

As shown in FIG. 5, panel (a) schematically shows a $HfS_3$ FET device with a relatively thin p-type surface of $HfS_3$ that forms due to dissociative chemisorption of oxygen species on n-type $HfS_3$. The AFM image of the $HfS_3$ with pure Au electrodes (45 nm thick) is shown in FIG. 5, panel (b). Its height profile (FIG. 5, panel (c)) shows that the $HfS_3$ semiconductor channel is about 20 nm high and 0.2 mm wide. FIG. 5, panel (d) shows the dependence of the drain-source current ($I_{DS}$) on the drain-source bias ($V_{DS}$) for gate voltage ($V_G$) ranging from −80 V to +80 V. The negligible drain-source current, at all the gate voltages, for drain-source voltages between (approximately) −0.3 V to +0.3 V is consistent with the Schottky-barrier formation, as unveiled by the XPS measurements; changes in the slopes of the $I_{DS}$-$V_{DS}$ plots are indicated by the vertical arrows. The electronic properties of a $HfS_3$ device depend on the background ambience. In vacuum, from the direct relationship between $I_{DS}$ and $V_G$, which is evident from the increasing $I_{DS}$ with increasing $V_G$ at a given $V_{DS}$ (see the red curve in FIG. 5, panel (e)), that in spite of a p-type surface layer, the as-synthesized $HfS_3$ is an n-type semiconducting material similar to $TiS_3$. When the same device is measured in air, $HfS_3$ exhibits p-type behavior, as shown by the black curve in FIG. 5, panel (e). As placing the $HfS_3$ FET device in vacuo, at about $2\times10^{-6}$ Torr, for 24 h results in the restoration the n-type electronic behavior (again, see the red curve in FIG. 5, panel (e)), much of the p-type doping has to be the result of weakly bound adsorbate species, such as $H_2O$ and $O_2$, on the surface of $HfS_3$. This is not surprising since adsorbates like $H_2O$ and $O_2$ are known for their p-doping effect on other 2D materials, such as graphene oxide. The Schottky-barrier formation seen in XPS (FIG. 4, panel (c)), in combination with the p-n junction formed between the p-type surface and the n-type bulk, and the overall transport characteristics at large source drain voltages (FIG. 5, panel (d)) are also consistent with the very low currents (~$10^{-11}$ A) measured here. Even though the I-V characteristics for the $HfS_3$ FET were measured in the presence of illumination, the observed currents are still far less than what is seen for similar $ZrS_3$ (~$10^{-7}$ A) and $TiS_3$ (~$10^{-6}$ A) FET devices in the absence of illumination. A comparison of the conductivity for the $HfS_3$ devices, in absence of irradiation, would be even more invidious.

Again, it is noted that the p-type behavior at surface of $HfS_3$ can become more significant because of the further weak chemisorption due to the ambient air.

EXPERIMENTAL $HfS_3$ crystals were synthesized through a reaction between metallic hafnium and sulfur vapor in vacuum-sealed quartz ampules at 600° C., as has been described previously [see, H. Haraldsen, A. Kjekshus, E. Rost, A. Steffensen and J. Munch-Petersen, *Acta Chem. Scand.,* 1963, 17, 1283-1292.]. After two weeks of annealing at 600° C., numerous 1-2 mm long $HfS_3$ crystals were formed. The powder X-ray diffraction (XRD) pattern of $HfS_3$ was recorded using a PANalytical Empyrean X-ray diffractometer with a 1.4 kW copper $K_a$ source (1=1.54187 Å). The powder diffraction patterns were collected from 5° to 150° 2θ using a step size of 0.02° 2θ. $HfS_3$ is generally isostructural with $TiS_3$ and $rS_3$, and belongs to the $P2_1/m$ space group with the unit cell parameters a=5.123(2) Å, b=3.624 (1) Å, c=8.991(1) Å, and the cant angle b=97.69(2°), as derived from the powder XRD pattern of $HfS_3$ shown in FIG. 5, panel (a). The obtained XRD pattern corresponds to that of pure monoclinic $HfS_3$.

The XPS measurements were used to characterize the $HfS_3$ crystal surfaces and interfaces with Au. All the XPS measurements were carried out using an aluminum SPECS X-ray anode (with E(Al Ka)=1486.6 eV) and a hemispherical electron analyzer (PHI Model: 10-360) in an ultra-high vacuum chamber with a base pressure better than $2\times10^{-10}$ Torr. A tungsten wire basket was used to thermally evaporate Au adlayers onto the $HfS_3$ crystals and a thickness monitor was used to determine their thicknesses.

A $HfS_3$ field-effect transistor (FET) was fabricated using a heavily p-doped Si as the substrate, with a 300 nm thick $SiO_2$ layer, as the substrate dielectric, and 45 nm thick and 1.5 mm wide pure Au as the source and drain electrodes. The atomic force microscopy (AFM) image of the $HfS_3$ FET was obtained using a Bruker Dimension Icon atomic force microscope.

The $HfS_3$-based device was prepared by the standard electron beam lithography using a Zeiss Supra 40 field-emission scanning electron microscope and a Raith pattern generator. The evaporation of Au electrodes was performed using an AJA electron beam evaporation system at the base pressure of ~$8\times10^{-9}$ Torr. For in vacuo measurements, the transport data for the $HfS_3$ FET was measured in a Lake Shore TTPX cryogenic probe station at a base pressure of about $2\times10^{-6}$ Torr; the device was kept in vacuum for several days before the measurements to minimize the effect of surface adsorbates, such as water and oxygen molecules, on the electronic characteristics. All the electrical transport measurements for the $HfS_3$ transistor were carried out under illumination by a halogen lamp to maximize conductance.

All references, including publications, patent applications, and patents, cited herein are hereby incorporated by reference to the same extent as if each reference were individually and specifically indicated to be incorporated by reference and were set forth in its entirety herein.

The use of the terms “a” and “an” and “the” and “at least one” and similar referents in the context of describing the disclosed subject matter (especially in the context of the following claims) are to be construed to cover both the singular and the plural, unless otherwise indicated herein or clearly contradicted by context. The use of the term “at least one” followed by a list of one or more items (for example, “at least one of A and B”) is to be construed to mean one item selected from the listed items (A or B) or any combination of two or more of the listed items (A and B), unless otherwise indicated herein or clearly contradicted by context. The terms “comprising,” “having,” “including,” and “containing” are to be construed as open-ended terms (i.e., meaning “including, but not limited to,”) unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., “such as”) provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A $HfS_3$-based semiconductor device, comprising:
- a substrate layer;
- a substrate dielectric layer formed on the substrate layer;
- a bulk layer formed on the substrate dielectric layer, the bulk layer comprising n-type $HfS_3$; and
- a p-type $HfS_3$ layer formed on the bulk layer, wherein the p-type $HfS_3$ layer comprises a two-dimensional hole gas (2DHG) layer.

2. The device of claim 1, wherein a surface of the $HfS_3$ layer is exposed to an ambient air.

3. The device of claim 2, wherein the substrate layer comprises p-doped Si.

4. The device of claim 1, wherein the substrate dielectric layer comprises $SiO_2$.

5. The device of claim 1, wherein the $HfS_3$-based semiconductor device is a field effect transistor device, and wherein the device further includes first and second electrodes located on the substrate dielectric layer and forming a semiconductor channel between the first and second electrodes.

6. The device of claim 5, wherein a Schottky-barrier is formed at an interface between a p-type $HfS_3$ surface and each of the first and second electrodes.

7. The device of claim 5, wherein the semiconductor channel has a width of 3.6 nm to 50 nm, a thickness of the $HfS_3$ layer is less than 40 nm, and a thickness of the dielectric layer is between 100 nm to 500 nm.

8. The device of claim 5, wherein the first and second electrodes each comprise Au.

9. The device of claim 5, wherein the semiconductor channel has a width of 3.5 nm to 50 nm, and wherein a thickness of the $HfS_3$ layer is between 1 nm and 40 nm, and wherein the thickness of the $HfS_3$ layer is uniform.

10. A $HfS_3$-based field effect transistor (FET) device, comprising:
- a Si substrate layer;
- a $SiO_2$ substrate dielectric layer formed on the Si substrate layer;
- a bulk layer formed on the $SiO_2$ substrate dielectric layer, the bulk layer comprising n-type $HfS_3$;
- a p-type $HfS_3$ layer formed on the bulk layer, wherein the p-type $HfS_3$ layer comprises a two-dimensional hole gas (2DHG) layer; and
- first and second Au electrodes located on the $SiO_2$ substrate dielectric layer and forming a semiconductor channel between the first and second electrodes.

11. The FET device of claim 10, wherein a Schottky-barrier is formed at an interface between a p-type $HfS_3$ surface and each of the first and second Au electrodes.

12. The device of claim 10, wherein a surface of the $HfS_3$ layer is exposed to air.

13. The device of claim 10, wherein the Si substrate layer comprises p-doped Si.

14. The device of claim 10, wherein the semiconductor channel has a width of 3.6 nm to 50 nm.

15. The device of claim 10, wherein the $HfS_3$ layer has a thickness of less than 40 nm.

16. The device of claim 10, wherein the dielectric layer has a thickness of between 100 nm to 500 nm.

17. The device of claim 10, wherein the semiconductor channel has a width of 3.5 nm to 50 nm, wherein a thickness of the $HfS_3$ layer is between 1 nm and 40 nm, and wherein the thickness of the $HfS_3$ layer is uniform.

18. The device of claim 10, wherein the semiconductor channel has a length of 0.1 mm to 0.5 mm, and wherein a thickness of the $HfS_3$ layer is between 1 nm and 40 nm.

* * * * *